(12) United States Patent
Asano et al.

(10) Patent No.: US 7,248,199 B2
(45) Date of Patent: Jul. 24, 2007

(54) ANALOG-TO-DIGITAL CONVERTER

(75) Inventors: Takashi Asano, Gifu (JP); Atsushi Wada, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/367,792

(22) Filed: Mar. 3, 2006

(65) Prior Publication Data
US 2006/0197693 A1    Sep. 7, 2006

(30) Foreign Application Priority Data
Mar. 4, 2005 (JP) .............................. 2005-060091
Feb. 17, 2006 (JP) .............................. 2006-040590

(51) Int. Cl.
*H03M 1/34* (2006.01)
(52) U.S. Cl. ........................ 341/163; 341/155
(58) Field of Classification Search ................ 341/143, 341/155, 162, 159, 122
See application file for complete search history.

(56) References Cited

U.S. PATENT DOCUMENTS 5,014,055 A * 5/1991 Dingwall et al. ........... 341/159
6,384,757 B1 * 5/2002 Kosonen ..................... 341/120
6,480,128 B1 * 11/2002 Bach et al. ................. 341/122
6,580,383 B1 * 6/2003 Devendorf et al. ......... 341/143
6,646,584 B2 * 11/2003 Nagaraj et al. ............. 341/155
2002/0097177 A1 * 7/2002 Nagaraj et al. ............. 341/155
2003/0117308 A1 * 6/2003 Kawahito et al. ........... 341/162

FOREIGN PATENT DOCUMENTS

JP         9-275342         10/1997

OTHER PUBLICATIONS

Patent Abstracts of Japan, Publication Date 09-275342, Publication Date Oct. 21, 1997, 1 page.

* cited by examiner

*Primary Examiner*—Jean Bruner Jeanglaude
(74) *Attorney, Agent, or Firm*—Osha Liang LLP

(57) ABSTRACT

In an analog-to-digital (A-D) converter, an A-D conversion circuit samples an analog signal and converts it to a digital value of a predetermined bit number less than a targeted bit number. An amplifier circuit is provided in parallel to the A-D conversion circuit, and holds the signal sampled by the A-D conversion circuit or amplifies it by a predetermined gain. A first source follower circuit for the amplifier circuit and a second source follower circuit for the A-D conversion circuit are provided separately at the output side of a sample-and-hold circuit.

16 Claims, 12 Drawing Sheets

2

DIGITAL VALUES

3

4

5

6

ANALOG-TO-DIGITAL CONVERTER

BACKGROUND OF THE INVENTION

1. Field of the Invention

The present invention generally relates to analog-to-digital converters and it particularly relates to an analog-to-digital converter of a pipeline type and the like in which analog signals are converted to digital signals a plurality of times.

2. Description of the Related Art

In response to the development of the digital signal processing technologies, there is a growing demand of analog-to-digital converter with high resolution and high speed. As an analog-to-digital converter like this (hereinafter referred to as "A-D converter"), an analog-to-digital converter of a pipeline type has been proposed. For example, an A-D converter of a pipeline type having the structure of four stages is laid open in FIG. 4 of Reference (1) in the following Related Art List. In this Reference (1), 4 bits, 3 bits, 3 bits and 3 bits are outputted and thus the total of 10 bits are outputted as digital values at the respective A-D converter blocks.

Related Art List (1) Japanese Patent Application Laid-Open No. Hei09-275342.

In FIG. 13 of the above Reference (1), a description was given of the A/D converter 42 of a flash type that includes a plurality of voltage comparator circuits 7.3 to 7.13. Also, in FIG. 14 of the above Reference (1), a description was given of the potential comparator 55 and the capacitors 51 to 54 connected to the input terminal thereof, as a structural component of the voltage comparator circuit 7.3.

In such a switched-capacitor type comparator as above, the voltage to store the electric charge in the capacitance needs to be switched by a switch. With this configuration, when the switch is switched, the input analog signal to the sample/hold circuit provided in parallel with the A/D converter changes due to the effect of the electric charge stored in the above capacitance, so that the settling time is longer and therefore the settling speed is slower. In FIG. 2 of the above Reference (1), there is a description of the circuit configuration in which the sample/hold circuit 14 is provided in parallel to the A/D converter 12.

SUMMARY OF THE INVENTION

The present invention has been made in view of the aforementioned circumstances and its general purpose is to provide an analog-to-digital converter that prevents the delay of settling time in signals inputted to a circuit which samples and holds analog signals inputted to an A-D conversion block.

In order to solve the above problems, an analog-to-digital (A-D) converter according to one embodiment of the present invention converts an analog signal to a digital signal a plurality of times, and it comprises: an A-D conversion circuit which samples a predetermined analog signal and converts it to a digital value of a predetermined bit number less than a targeted bit number; a first holding circuit which at least holds the analog signal sampled by the A-D conversion circuit; and a buffer circuit provided on a path connecting an input side of the A-D conversion circuit with an input side of the first holding circuit. The "buffer circuit" may be a source follower circuit. The "first holding circuit" may hold the sampled analog signal while amplifying it and may output an analog signal amplified by a predetermined factor of the sampled analog signal. Also, the sampled analog signal may be held, a signal for which an output digital value of the A-D conversion circuit has been D-A converted is subtracted from said analog signal, and the signal after the subtraction may be amplified by a predetermined gain. In such a case, there may be provided a "first holding circuit" in addition to a subtracter circuit, or the subtracter circuit may have a holding function.

According to this embodiment, a buffer circuit is provided on a path connecting an input side of an A-D conversion circuit with an input side of a first holding circuit. As a result thereof, the effect of noise generated from the A-D conversion circuit can be reduced and the delay in settling time of an input signal to the first holding circuit can be prevented.

The analog-to-digital converter may further comprise: a plurality of second holding circuits which sample and hold a plurality of analog signals to be inputted, respectively; and a signal selector which selects any of outputs of the plurality of second holding circuits and which outputs a selected output to the A-D conversion circuit and the first holding circuit. By employing this structure, when the selection at the signal selector is switched by the buffer circuit, the effect of the noise components caused in the A-D conversion circuit prior to the switching on the analog signal inputted to the first holding circuit after the switching can be reduced. Thus, when the analog-to-digital converter operates for a multi-channel input, the risk of transmitting among the channels the effect of noise generated from the A-D conversion circuit can be reduced and therefore the conversion precision of the analog-to-digital converter can be enhanced.

The respective plurality of second holding circuits may output, in a branched manner, the analog signal held to a path for use with the A-D conversion circuit and a path for use with the first holding circuit, and the buffer circuit may be provided on the path for use with the A-D conversion circuit. In this case, the buffer circuit provided on the path for use with the A-D conversion circuit can reduce the effect of the noise generated from the A-D conversion circuit on the input signal to the first holding circuit.

The buffer circuit may be provided on the path for use with the first holding circuit, in addition to the path for use with the A-D conversion circuit. By implementing this structure, the effect of the noise generated from the first holding circuit on the input signal to the A-D conversion circuit can be reduced and therefore the conversion precision of the analog-to-digital converter is raised.

The power supply voltage of a circuit element placed posterior to the buffer circuit when viewed from an input side of the analog signal may be less than that of a circuit element placed anterior thereto. The buffer circuit may function as a voltage converter circuit that steps down the inputted analog signal by a predetermined level. With this structure, the power consumed by the analog-to-digital converter can be reduced. Since the buffer circuit functions as a voltage converter circuit, the necessity of providing another voltage converting circuit is no longer required, the power consumption can be reduced and at the same time the increase in circuit scale can be prevented.

Another embodiment of the present invention relates also to an analog-to-digital (A-D) converter. This A-D converter converts an analog signal to a digital signal a plurality of times, and it comprises: a predetermined circuit element which outputs an analog signal; an A-D conversion circuit which samples the analog signal outputted from the predetermined circuit element and converts it to a digital value of a predetermined bit number less than a targeted bit number;

and a first holding circuit, provided in parallel with the A-D conversion circuit, which at least holds the analog signal sampled by the A-D conversion circuit. A buffer circuit for the first holding circuit and a buffer circuit for the A-D conversion circuit are separately provided at an output side of the predetermined circuit element. The "predetermined circuit element" may be a sample-and-hold circuit According to this embodiment, the buffer circuit for the first holding circuit and the buffer circuit for the A-D conversion circuit are provided separately. As a result thereof, the effect of noise generated from the A-D conversion circuit can be reduced and the delay in settling time of an input signal to the first holding circuit can be prevented. Furthermore, the sum of current flowing to the respective buffer circuits can be reduced, compared to the case when there is provided a single buffer circuit and the current flows to this single buffer circuit.

The buffer circuit for the first holding circuit may be provided on a path connecting the predetermined circuit element with the first holding circuit, whereas the buffer circuit for the A-D conversion circuit may be provided on a path connecting a connection point of the predetermined circuit element and the buffer circuit for the first holding circuit with the A-D conversion circuit. According to this embodiment, the noise components from the A-D conversion circuit pass through at least two buffer circuits, so that the effect of these noise components on the input signal to the first holding circuit can be reduced.

The A-D conversion circuit may receive the analog signal at one end of a capacitance connected to the input side thereof, and include a voltage comparison element of capacitive coupling input type that samples the analog signal appearing at the other end of the capacitance. With this structure where a switched-capacitor type comparator is included in the A-D converter, the noise component caused by the electric charge flowing out from a capacitance connected to the voltage comparison element can be reduced.

The first holding circuit and the A-D conversion circuit may be included in a block where the analog signal is first converted to the digital value. The first conversion to the digital values requires the higher degree of precision than the subsequent conversions. According to this embodiment, the deterioration in the characteristics of the first holding circuit can be suppressed and therefore the deterioration in the characteristics of the A-D converter as a whole can be effectively suppressed.

The analog-to-digital converter may further comprise: a D-A conversion circuit which converts an output signal of the A-D conversion circuit to an analog signal; and a subtracter circuit which subtracts the output signal of the D-A conversion circuit from an output signal of said first holding circuit, wherein, during a holding period, the first holding circuit may amplify the sampled analog signal by a predetermined gain, and the subtracter circuit may subtract the output signal of the conversion circuit amplified at the same predetermined gain. The "same" may include cases of "practically or substantially the same" where parameters fluctuate slightly, from the values determined by the specifications, due to a change in the environment such as temperature and voltage variations. According to this embodiment, the deterioration in the characteristics of the A-D converter as a whole can be effectively suppressed by restricting the deterioration in the characteristics of signals before amplification.

Arbitrary combinations of the aforementioned constituting elements, and the implementation of the present invention in the form of a method, an apparatus, a system, a computer program, a data structure and so forth may also be effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

First Embodiment

As a first embodiment of the present invention, a description will be given of an example where, in an A-D converter of pipeline type and cyclic type (described later), there is provided a source follower circuit on a path which connects an A-D converter block with an amplifier circuit serving as a holding circuit for at least holding the analog signals inputted to said A-D converter block, in order to reduce the effect of noise generated from the A-D converter block of a first stage.

Figure 1:
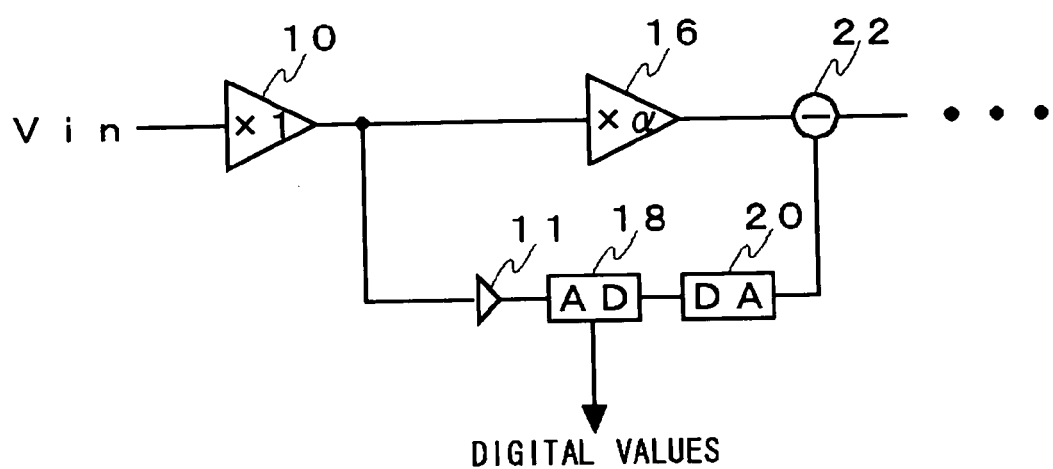
FIG. 1 illustrates a partial structure of an A-D converter according to a first embodiment of the present invention.

FIG. 1 illustrates a partial circuit of an A-D converter 1 according to a first embodiment of the present invention. This partial circuit illustrates a structure of the first stage of an A-D convert of pipeline type and cyclic type (described later).

A sample-and-hold circuit 10 samples an analog signal Vin inputted externally, namely, an analog signal to be inputted to an amplifier circuit 16 and an A-D conversion circuit 18, and holds it for a predetermined time of period. For example, the sample-and-hold circuit 10 samples the analog signal which has undergone photoelectric conversion by CCD (Charge Coupled Device) and has passed through a CDS (Correlated Double Sampling), a variable amplifier and the like. If there are a plurality of inputs, a plurality of sample-and-hold circuits in response thereto will be provided and one of them will be selected by a switch (not shown). The sample-and-hold circuit 10 outputs the analog signal held to an amplifier circuit 16, and the same signal is outputted to an A-D conversion circuit 18 via a source follower circuit 11.

When an amplifying stage having a large load impedance drives a low impedance, the source follower circuit 11 is generally inserted as a buffer in a manner that the loss of signal voltage is negligible. In the A-D convert 1, the source follower circuit 11 is used to reduce the current and protect against noise.

With the same timing, the amplifier circuit 16 samples an output analog signal of the sample-and-hold circuit 10 whereas the A-D conversion circuit 18 samples an output analog signal of the source follower circuit 11. The amplifier circuit 16 can hold the sampled analog signal for a predetermined period of time, or can amplify the sampled analog signal by a predetermined gain and output it to a subtracter circuit 22 at a predetermined timing. This predetermined timing corresponds to the completion timing of the A-D conversion and D-A conversion on a path containing an A-D conversion circuit 18 and a D-A conversion circuit 20 provided in parallel with the amplifier circuit 16.

The A-D conversion circuit 18 may use a flash-type one. The resolution thereof, namely, the number of bits to be converted is smaller than that to be converted by the A-D converter 1 as a whole. For example, when 10 or 13 bits are to be converted in total, 4 bits may be converted. The A-D conversion circuit 18 outputs digital signals converted from the inputted analog signal, to an encoder (not shown) and the D-A conversion circuit 20.

The D-A conversion circuit 20 converts the digital value converted by the A-D conversion circuit 18 into an analog value and outputs it to the subtracter circuit 22. The D-A conversion circuit 20 amplifies it according to a gain of the amplifier circuit 16 so as to output the analog value. For example, when the amplifier circuit 16 amplifies the input signal by a factor of 2, the D-A conversion circuit 20 converts the analog signal by a factor of 2, too. The subtracter circuit 22 subtracts the output of the D-A conversion circuit 20 from the output of the amplifier circuit 16 and outputs the result thereof to a subsequent circuit (not shown).

Here, a brief description will be given of an example of how to amplify the output of the D-A conversion circuit 20 by a factor of 2. A high potential side reference voltage VRT and a low potential side reference voltage VRB are supplied to the A-D conversion circuit 18 and the D-A conversion circuit 20. The A-D conversion circuit 18 produces a reference voltage by utilizing the reference voltage range generated based on the high potential side reference voltage VRT and the low potential side reference voltage VRB. When D-A conversion of capacitor array type is carried out, the D-A conversion circuit 20 obtains an output voltage by supplying selectively the high potential side reference voltage VRT and the low potential side reference voltage VRB to a plurality of capacitances (not shown), respectively, under a control from the A-D conversion circuit 18. In this manner, the reference voltage range of the D-A conversion circuit 20 is generally produced also based on the high potential side reference voltage VRT and the low potential side reference voltage VRB. In doing so, it is preferable that the ratio of the reference voltage range of the A-D conversion circuit 18 to that of the D-A conversion circuit 20 be set to 1:2 to achieve 2× amplification. For example, the ratio 1:2 can be achieved by a structure such that the input of the reference voltage of the A-D conversion circuit 18 is a single input operation and the output of the reference of the D-A conversion circuit 20 is a differential.

Comparative Example 1

Figure 2:
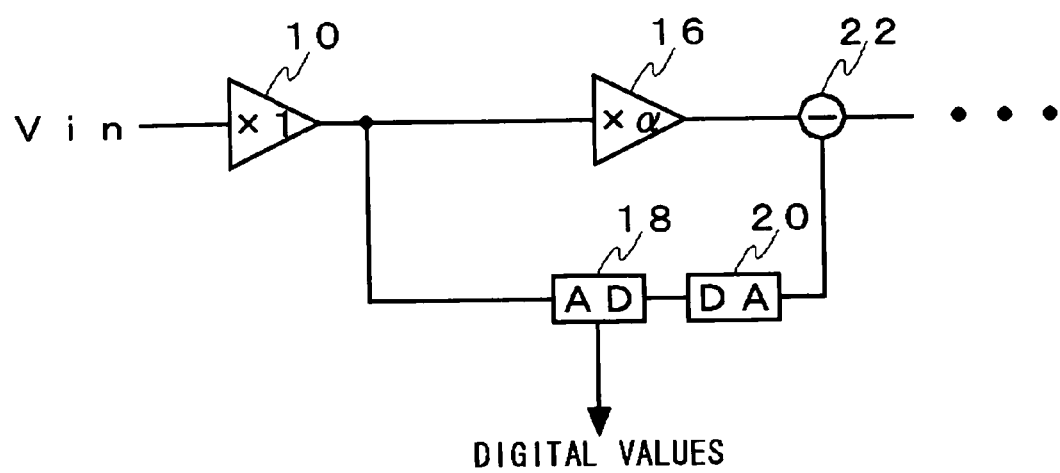
FIG. 2 shows a partial circuit of an A-D converter in a comparative example with the first embodiment.

FIG. 2 shows a partial circuit of the A-D converter 2 in a comparative example with that of FIG. 1. The configuration of this A-D converter 2 in the comparative example 1 is basically the same as the A-D converter 1 of FIG. 1. The comparative example 1 differs from the first embodiment in that no source follower circuit 11 is provided.

If the configuration is such that the above-mentioned switched-capacitor type comparator is included in the A-D conversion circuit 18, the A-D conversion circuit 18 chops the inputted analog signal so as to sample the analog signal of a predetermined time. Hence the electric charge is stored in the capacitance connected to the input terminal thereof. This electric charge is inputted to the comparator, thus turning on the switch. Then the electric charge flowing out from the capacitance flows also into the amplifier circuit 16, and becomes a noise component. The source follower circuit 11 that functions as a buffer is not inserted in the A-D converter 2 in the comparative example 1. As a result, the electric charge flowing out therefrom gives an adverse effect directly on the amplifier circuit 16.

In order to reduce the effect by the above-mentioned noise component in the configuration of the A-D converter 2 in the comparative example 1, the current flowing to an operation amplifier needs to be larger, in which case the current consumption will increase.

In contrast to this, a configuration of the A-D converter 1 in the first embodiment is such that a source follower circuit 11 is provided on a path connecting the A-D conversion circuit 18 with the amplifier circuit 16. Since the source follower circuit is a circuit of high impedance, the noise component flowing from the A-D conversion circuit 18 into the input terminal of the amplifier circuit 16 rarely affects the MOS gate potential which is the input terminal of the source follower circuit 11. Thus, the effect caused by the noise component on the amplifier circuit 16 is negligible and therefore the effect of the signal inputted from the sample-and-hold circuit 10 to the amplifier circuit 16 upon the settling time can be eliminated almost completely.

In this manner, in the A-D converter 1 according to the first embodiment the current flowing to the amplifier circuit 16 needs not to be large in the light of protection against the noise. Thus, in order to suppress the effect of the noise component from the A-D converter 1 in the first embodiment and that from the A-D converter 2 in the comparative example 1 to the same level, the current flowing to the amplifier circuit 16 can be made smaller than that flowing to the source follower circuit 11. Hence, with less current consumption, the A-D converter 1 in the first embodiment can suppress the delay in settling time of the amplifier circuit 16 more effectively than the A-D converter 2 in the comparative example 1.

By employing the structure according to the first embodiment as described above, the effect of noise components flowing from an A-D conversion circuit into an amplifier circuit provided in parallel therewith can be reduced and the delay in settling time of signals inputted to the amplifier circuit can be suppressed. That is, the provision of a source follower circuit on a path connecting between said A-D conversion circuit and said amplifier circuit can reduce the effect of the noise component. In other words, the noise components generated from said A-D conversion circuit can be reduced by the source follower circuit, and the noise component rarely flows into the input terminal of said amplifier circuit. Thus, there is no need of making the current flowing to said amplifier circuit large, so that the current reduction and the prevention of delay in settling time can both be achieved simultaneously.

Second Embodiment

As a second embodiment of the present invention, a description will be given of an example where, in an A-D converter of pipeline type and cyclic type (described later), there are provided two source follower circuits, connected in parallel to each other, on a path which connects between an output of a sample-and-hold circuit outputting an analog signal and a subsequent circuit elements, in order to reduce the effect of noise generated from the A-D converter block of a first stage.

Figure 3:
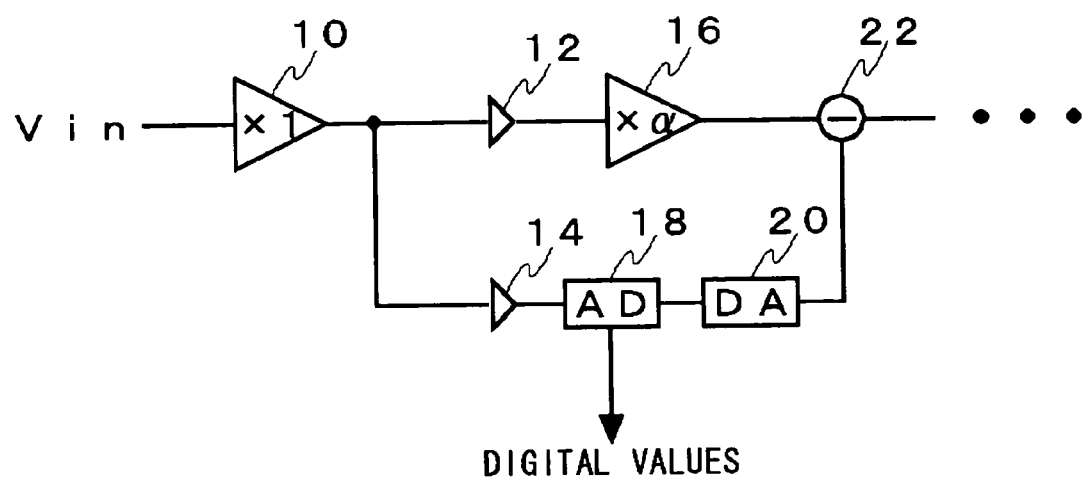
FIG. 3 illustrates a partial circuit of an A-D converter according to a second embodiment of the present invention.

FIG. 3 illustrates a partial circuit of an A-D converter 3 according to a second embodiment of the present invention. This partial circuit illustrates a structure of the first stage of an A-D convert of pipeline type and cyclic type (described later).

A sample-and-hold circuit 10 samples an analog signal Vin inputted externally and holds it for a predetermined time of period. For example, the sample-and-hold circuit 10 samples the analog signal Vin which has undergone photoelectric conversion by CCD (Charge Coupled Device) and has passed through a CDS (Correlated Double Sampling), a variable amplifier and the like. If there are a plurality of inputs, a plurality of sample-and-hold circuits in response thereto will be provided and one of them will be selected by a switch (not shown). The sample-and-hold circuit 10 outputs the analog signal held to an amplifier circuit 16 via a first source follower circuit 12, and the same signal is outputted to an A-D conversion circuit 18 via a second source follower circuit 14.

When an amplifying stage having a large load impedance drives a low impedance, the source follower circuit 12 and the second source follower circuit 14 are generally inserted as buffers in a manner that the loss of signal voltage is negligible. In the A-D converter 3, the first source follower circuit 12 and the second source follower circuit 14 are used to reduce the current and protect against noise. Hereinbelow, a description will be given of an example of the configuration for the first source follower circuit 12 and the second source follower circuit 14.

Figure 4:
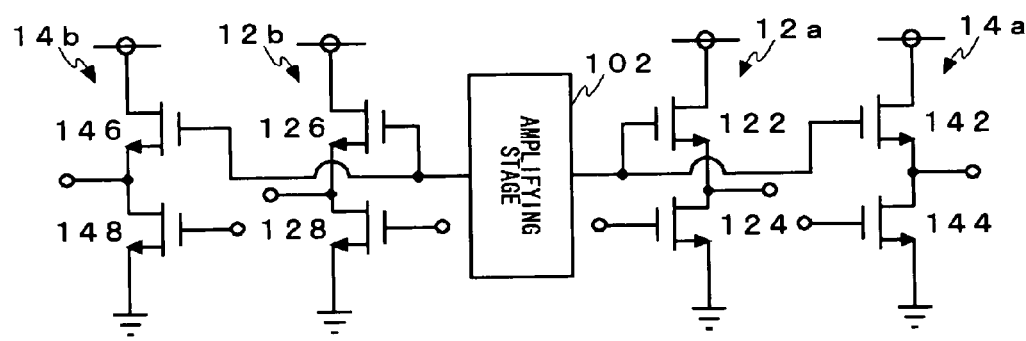
FIG. 4 illustrates a structure according to a second embodiment where a first source follower circuit and a second source follower circuit are connected to an output of an amplifying stage 10 in a sample-and-hold circuit.

FIG. 4 illustrates a structure in which the first source follower circuit 12 and the second source follower circuit 14 are connected to an output of an amplifying stage 102 in the sample-and-hold circuit 10. The sample-and-hold circuit 10 includes an operational amplifier which amplifies an input signal through a plurality of stages. The amplifying stage 102 in FIG. 4 shows the final stage in the plurality of stages.

FIG. 4 illustrates an example where the analog signal to be outputted to the amplifier circuit 16 and the A-D conversion circuit 18 are conveyed thereto by a differential signal. If conveyed by a single-ended signal, only the half of a circuit which is of a form symmetric about the amplifying stage 102 being the center in FIG. 4 will be used. The first source follower circuit 12 is comprised of a pair of N-channel MOS transistors (hereinafter referred to simply as NMOS) 122 and 126. Each drain of the NMOS 122 and NMOS 126 is connected to a power supply voltage VDD. The output voltage of the amplifying stage 102 is applied to the gate thereof. The source potential thereof becomes an output voltage and is applied to the amplifier circuit 16 as an output signal.

The sources of the NMOS 122 and NMOS 126 are connected respectively to NMOS 124 and NMOS 128 which are used as constant current sources. If not much precision is required in the input-output characteristics, resistors may be used in place of the NMOS 124 and NMOS 128. The drains of the NMOS 124 and NMOS 128 are connected respectively to the sources of the NMOS 122 and NMOS 126, and the sources of the NMOS 124 and NMOS 128 are connected to the ground. A predetermined bias voltage is applied to the gates of the NMOS 124 and NMOS 128. This circuit allows the source potential of the NMOS 122 and NMOS 126 to follow the gate voltage thereof.

Using also NMOS 142, NMOS 146, NMOS 144 and NMOS 148, the second source follower circuit 14 is configured similarly to the first source follower circuit 12. The source potentials of the NMOS 142 and NMOS 146 become output voltages and are applied to the A-D conversion circuit 18 as output signals.

With the same timing, the amplifier circuit 16 samples an output analog signal of the first source follower circuit 12 whereas the A-D conversion circuit 18 samples an output analog signal of the second source follower circuit 14. The amplifier circuit 16 can hold the sampled analog signal for a predetermined period of time, or can amplify the sampled analog signal by a predetermined gain and output it to a subtracter circuit 22 at a predetermined timing. This predetermined timing corresponds to the completion timing of the A-D conversion and D-A conversion on a path containing an A-D conversion circuit 18 and a D-A conversion circuit 20 provided in parallel with the amplifier circuit 16.

The A-D conversion circuit 18 may use a flash-type one. The resolution thereof, namely, the number of bits to be converted is smaller than that to be converted by the A-D converter 3 as a whole. For example, when 10 or 13 bits are to be converted in total, 4 bits may be converted. The A-D conversion circuit 18 outputs the digital signals converted from the inputted analog signal, to an encoder (not shown) and the D-A conversion circuit 20.

The D-A conversion circuit 20 converts the digital value converted by the A-D conversion circuit 18 into an analog value and outputs it to the subtracter circuit 22. The D-A conversion circuit 20 amplifies it according to a gain of the amplifier circuit 16 so as to output the analog value. For example, when the amplifier circuit 16 amplifies the input signal by a factor of 2, the D-A conversion circuit 20 converts the analog signal by a factor of 2, too. The subtracter circuit 22 subtracts the output of the D-A conversion circuit 20 from the output of the amplifier circuit 16 and outputs the result thereof to a subsequent circuit (not shown).

Comparative Example 2

Figure 5:
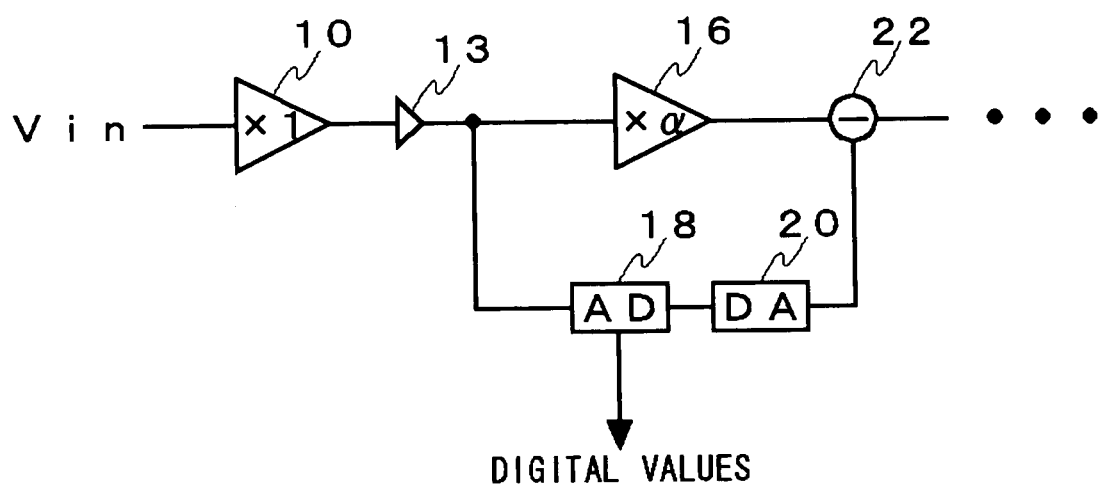
FIG. 5 illustrates a partial circuit of an A-D converter in a comparative example with the second embodiment.

FIG. 5 shows a partial circuit of the A-D converter 4 in a comparative example with that of FIG. 3. The configuration of this A-D converter 4 in the comparative example 2 is basically the same as the A-D converter 3 of FIG. 3. The points different from the second embodiment will now be described here. The output of a sample-and-hold circuit 10 is connected to a single source follower circuit (third source follower circuit 13). The same analog signal of the third source follower circuit 13 is outputted to the sample-and-hold circuit 10 and an amplifier circuit 16.

Figure 6:
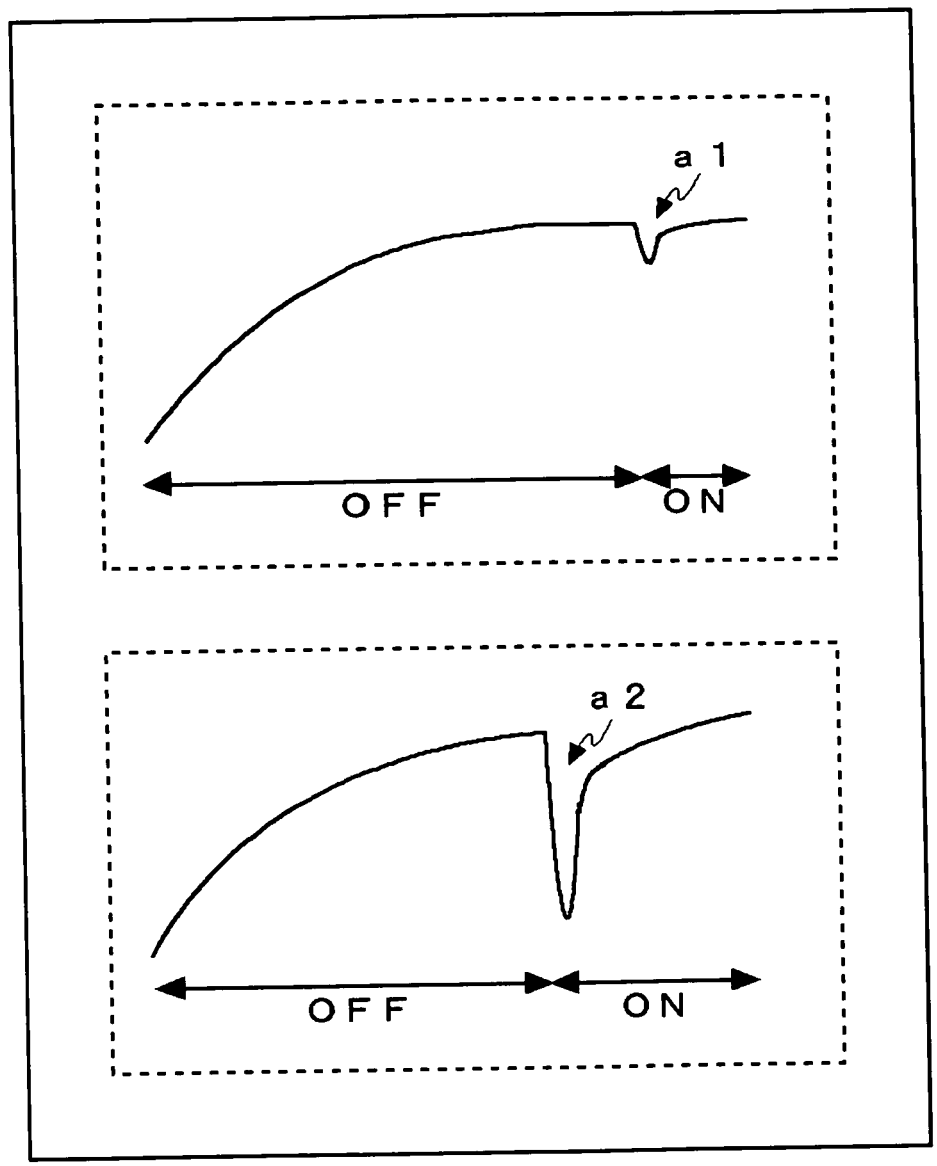
FIG. 6 is an illustration to compare the characteristics of analog signals inputted to the amplifier circuits.

FIG. 6 is an illustration to compare the characteristics of analog signals inputted to the amplifier circuits 16. The analog waveform on the top of FIG. 6 shows a waveform of the amplifier circuit 16 in the A-D converter 3 of the second embodiment whereas that on the bottom thereof is a waveform of the amplifier circuit 16 in the A-D converter 4 of the comparative example 2.

If the configuration is such that the above-mentioned switched-capacitor type comparator is included in the A-D conversion circuit 18, the A-D conversion circuit 18 chops the inputted analog signal so as to sample the analog signal of a predetermined time. Hence the electric charge is stored in the capacitance connected to the input terminal thereof. This electric charge is inputted to the comparator, thus turning on the switch. Then the electric charge flowing out from the capacitance is delivered also to the amplifier circuit 16, and becomes a noise component. In the A-D converter 4 in the comparative example 2, no circuit element is inserted in a path that connects between the A-D conversion circuit 18 and the amplifier circuit 16. As a result, the electric charge flowing out therefrom becomes directly a noise component of the output signal of the third source follower circuit 13. A large distortion a2 caused by this noise component occurs in the analog waveform shown in the bottom of FIG. 6, and the settling time is delayed.

In order to reduce the effect by the above-mentioned noise component in the configuration of the A-D converter 4 in the comparative example 2, the current delivered to the third source follower circuit 13 needs to be made larger, the circuit behavior needs to be faster and the output signals of the third source follower circuit 13 affected by said noise component need to be corrected faster. This, however, increases the current consumption.

In contrast to this, a configuration of the A-D converter 3 in the second embodiment is such that the first source follower circuit 12 and the second source follower circuit 14 are provided on a path connecting the A-D conversion circuit 18 with the amplifier circuit 16. Since the source follower circuit is a circuit of high impedance, the noise component flowing from the A-D conversion circuit 18 into the input terminal of the second source follower circuit 14 rarely affects the MOS gate potential which is the input terminal of the second source follower circuit 14. Thus, the effect caused by the noise component on the first source follower circuit 12 is negligible and therefore the effect of the signal inputted from the first source follower circuit 12 to the amplifier circuit 16 upon the settling time can be eliminated almost completely. As can be seen from the analog waveform in the top of FIG. 6, the distortion a1 much smaller than the above a2 occurs and has only a limited effect on the settling time.

In this manner, in the A-D converter 3 according to the second embodiment the current delivered to the first source follower circuit 12 needs not to be large in the light of protection against the noise. Thus, in order to suppress the effect of the noise component from the A-D converter 3 in the second embodiment and that from the A-D converter 4 in the comparative example 2 to the same level, the sum of current flowing to the first source follower circuit 12 and the second source follower 14 can be made smaller than that flowing to the third source follower circuit 13. Hence, with less current consumption, the A-D converter 3 in the second embodiment can suppress the delay in settling time of the amplifier circuit 16 more effectively than the A-D converter 4 in the comparative example 2.

By employing the structure according to the second embodiment as described above, the effect of noise components flowing from an A-D conversion circuit into an amplifier circuit provided in parallel therewith can be reduced and the delay in settling time of signals inputted to the amplifier circuit can be suppressed. That is, the inserting two source follower circuits on a path connecting between said A-D conversion circuit and said amplifier circuit can reduce the effect of the noise component. In other words, the noise components generated from said A-D conversion circuit can be reduced by the source follower circuit provided at the A-D conversion circuit side, and the noise component rarely flows into the input terminal of the source follower circuit provided between a circuit element, such as the sample-and-hold circuit in the preceding stage, and said amplifier circuit. Thus, there is no need of making the current flowing to said source follower circuit large, so that the current reduction and the prevention of delay in settling time can both be achieved at the same time. Since said amplifier circuit requires the higher degree of precision than said A-D conversion circuit, this advantageous effect of preventing the delay time in settling time contributes significantly to maintaining the characteristic of the entire A-D converter.

Third Embodiment

Figure 7:
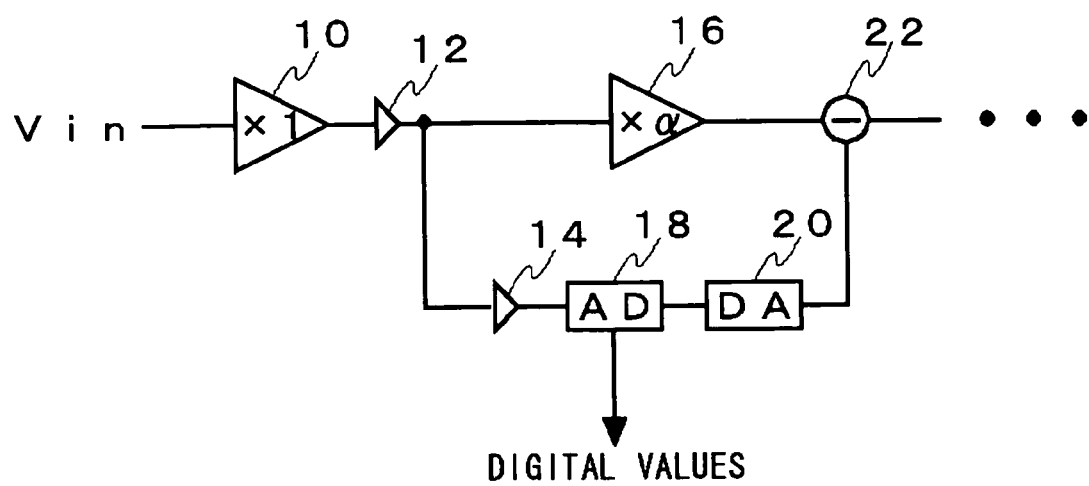
FIG. 7 illustrates a partial circuit of an A-D converter according to a third embodiment of the present invention.

FIG. 7 illustrates a partial circuit of an A-D converter 5 according to a third embodiment of the present invention. The structure of this A-D converter 5 is basically the same as that of the A-D converter 3 shown in FIG. 3, and the difference therefrom will be described here. An output of a sample-and-hold circuit 10 is connected to a first source follower circuit 12. The first follower circuit 12 outputs the same analog signal to an amplifier circuit 16 and a second source follower circuit 14. The second follower circuit 14 outputs an output signal to an A-D conversion circuit 18.

According to the third embodiment, the second source follower circuit 14 is provided on a path connecting between the A-D conversion circuit and the amplifier circuit. Thereby, the effect of noise components from the A-D conversion circuit can be reduced more effectively than the comparative example 2 of the second embodiment, so that the same advantageous effects as with the second embodiment can be attained.

Fourth Embodiment

Figure 8:
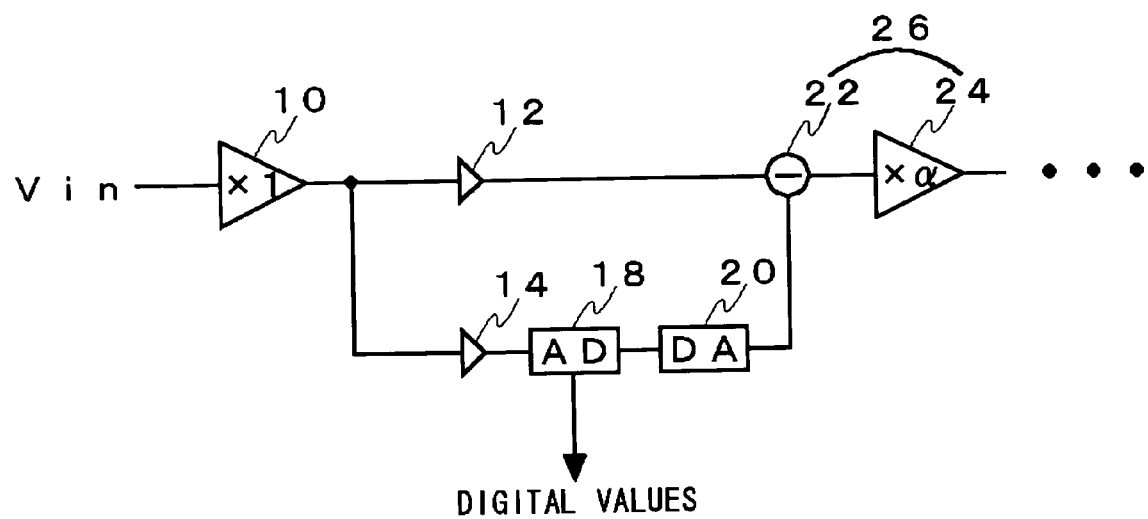
FIG. 8 illustrates a partial circuit of an A-D converter according to a fourth embodiment of the present invention.

FIG. 8 illustrates a partial circuit of an A-D converter 6 according to a fourth embodiment of the present invention. The structure of this A-D converter 6 is basically the same as that of the A-D converter 3 shown in FIG. 3, and the difference therefrom will be described here. The A-D converter 6 according to the fourth embodiment is structured such that the amplifier circuit 16 otherwise provided between a sample-and-hold circuit 10 and a subtracter circuit 22 is omitted. A subtracter-amplifier circuit 26 has both a function as a subtracter circuit 22 that subtracts an output signal of a D-A conversion circuit from an output of the sample-and-hold circuit 10 and a function as an amplifier circuit 24 that amplifies the subtraction result by a predetermined gain. This subtracter-amplifier circuit 26 has a storage function. This storage function can be realized by adjusting the timing. For example, it is preferable that the subtracter-amplifier circuit 26 sample the output analog signal of the sample-and-hold circuit 10 with the timing almost identical to the sampling timing of the A-D conversion circuit 18. Thereby, the circuit configuration can be simplified.

According to the fourth embodiment, a source follower circuit 12 is provided on a path connecting between the A-D conversion circuit and the subtracter-amplifier circuit. Thereby, the effect of noise components flowing from the A-D conversion circuit into the subtracter-amplifier circuit can be reduced and the delay in settling time of signals inputted to the subtracter-amplifier circuit can be restricted.

Fifth Embodiment

A fifth embodiment of the present invention is an example in which the partial circuit described in the second embodiment is applied to an A-D converter 7 of a cyclic type. This A-D converter 7 is structured such that 4 bits are converted in the preceding stage of a non-cyclic type, 2 bits are converted in the subsequent stage of a cyclic type per cycle and, as a result of performing three cycles of 2 bit conversion in the subsequent stage, the total of 10 bits are outputted.

Figure 9:
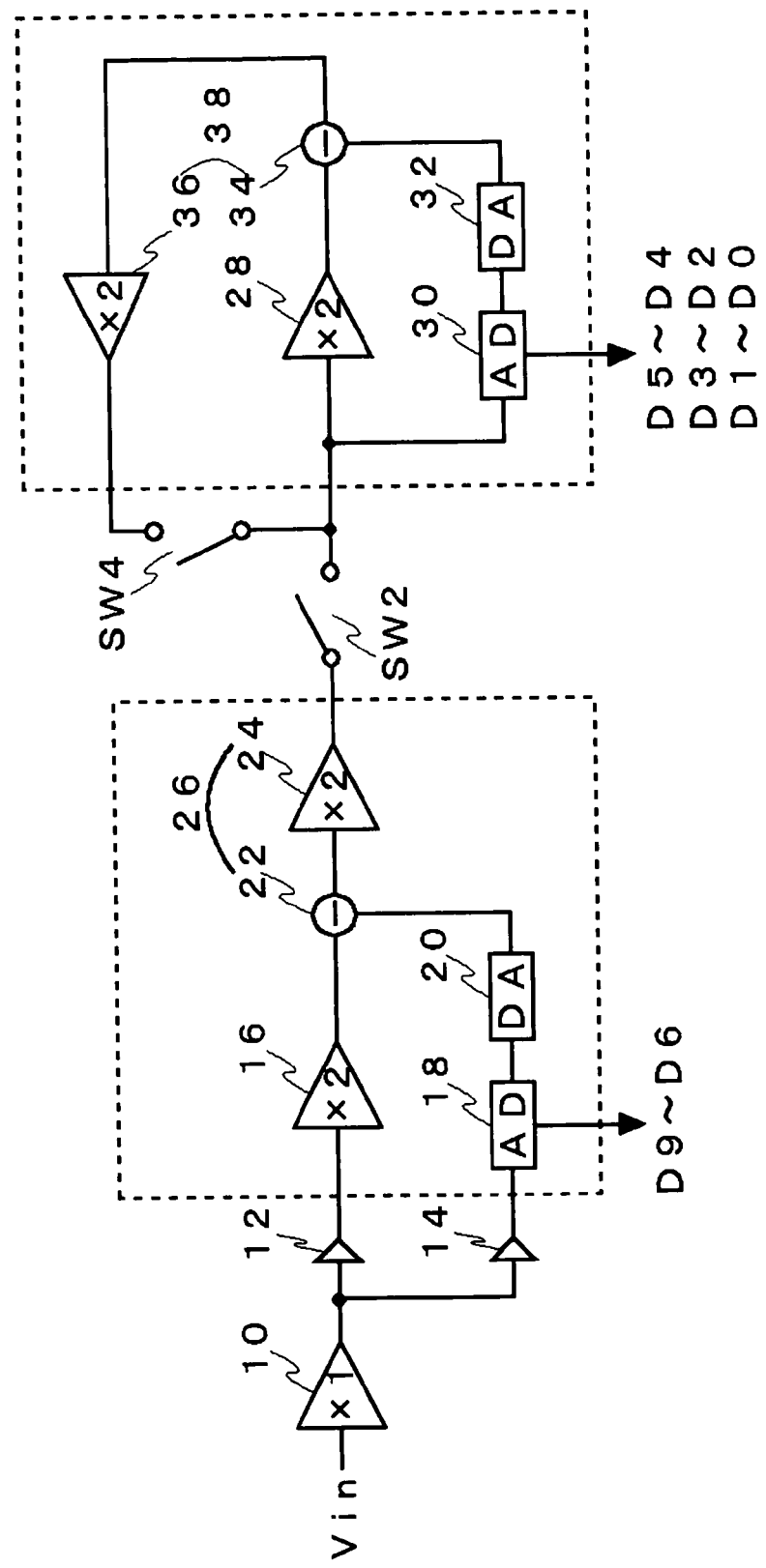
FIG. 9 illustrates a partial circuit of an A-D converter according to a fifth embodiment of the present invention.

FIG. 9 illustrates a structure of the A-D converter 7 according to the fifth embodiment of present invention. A sample-and-hold circuit 10 samples an analog signal Vin inputted externally and holds it for a predetermined period of time. Then the analog signal held is outputted to an amplifier circuit 16 via a first source follower circuit 12, and the same analog signal is outputted to an A-D conversion circuit 18 via a second source follower circuit 14.

Next, a description will be given of the preceding stage of the A-D converter 7. The first A-D conversion circuit 18 is a flash type whose resolution, namely the number of bits to be converted, is 4 bits. The first A-D conversion circuit 18 converts the input analog signal into a digital value, retrieves 4 higher-order bits (D9 to D6) and outputs them to an encoder (not shown) and a first D-A conversion circuit 20. The first D-A conversion circuit 20 converts the digital value converted by the first A-D conversion circuit 18 into an analog signal. A first amplifier circuit 16 samples the inputted analog signal, amplifies it by a factor of 2 and outputs the thus amplified signal to a first subtracter circuit 22. The first subtracter circuit 22 subtracts the output of the first D-A conversion circuit 20 from the output of the first amplifier circuit 16. Here, the output of the first D-A conversion circuit 20 has been amplified by 2×. A second amplifier circuit 24 amplifies the output of the first subtracter circuit 22 by a factor of 2. A second A-D conversion circuit 30, which performs a 2-bit conversion, must amplify the signal practically by a factor of 4 (2 squared). It is to be noted that the first subtracter circuit 22 and the second amplifier circuit 24 may be formed as the integrally structured first subtracter-amplifier circuit 26. With this structure, the circuit can be simplified.

A description will now be given of the subsequent stage of the A-D converter 7. A first switch SW2 and a second switch SW4 turn on and off alternately with each other. When the first switch SW2 is on and the second switch SW4 is off, an analog signal inputted from the preceding stage via the first switch SW2 is inputted to a third amplifier circuit 28 and a second A-D conversion circuit 30. The second A-D conversion circuit 30 is also a flash type whose resolution, namely the number of bits not including one redundant bit, is 2 bits. The second A-D conversion circuit 30 converts the inputted analog signal into a digital value, retrieves three bits composed of the 5th and 6th higher-order bits (D5 and D4) and one redundant bit and outputs them to an encoder (not shown) and a second D-A conversion circuit 32. The second D-A conversion circuit 32 converts the digital value converted by the second A-D conversion circuit 30 into an analog value.

The third amplifier circuit 28 amplifies the inputted analog signal by a factor of 2 and outputs the resulting signal to a second subtracter circuit 34. The second subtracter circuit 34 subtracts the output of the second D-A conversion circuit 32 from the output of the third amplifier circuit 28 and outputs the subtraction result to a fourth amplifier circuit 36. The output of the second D-A conversion circuit 32 has been amplified practically by a factor of 2. It is to be noted that the second subtracter circuit 34 and the fourth amplifier circuit 36 may be formed as an integrally structured second subtracter-amplifier circuit 38.

The fourth amplifier circuit 36 amplifies the output of the second subtracter circuit 34 by a factor of 2. At this stage, the first switch SW2 is off and the second switch SW4 is on. Thus the analog signal amplified at the fourth amplifier circuit 36 is fed back to the third amplifier circuit 28 and the second A-D conversion circuit 30 via the second switch SW4. From here on, the above-described processing is repeated, and the second A-D conversion circuit 30 retrieves three bits composed of the 7th and 8th higher-order bits (D3 and D2) and one redundant bit and another three bits composed of the 9th and 10th higher-order bits (D1 and D0) and one redundant bit. In this manner, a digital value composed of ten bits is obtained. The 5th to 10th higher-order bits are obtained in the cyclic-type subsequent stage.

According to the fifth embodiment as described above, the effect of noise components flowing from the A-D conversion circuit in the preceding stage into the path to the amplifier circuit of the same stage provided in parallel therewith can be reduced and the delay in settling time of signals inputted to this amplifier circuit can be suppressed. As with this amplifier circuit, the amplifier circuit provided in parallel with the A-D conversion circuit of the first stage requires the higher degree of precision than the A-D conversion circuit at the same stage and the amplifier circuits and A-D conversion circuits at the stages subsequent thereto. In the A-D converter 7 according to the fifth embodiment, the first amplifier circuit 16 requires 10-bit precision whereas the first A-D conversion circuit 18 requires 4-bit precision. If the amplifier circuit provided in parallel with the A-D conversion circuit has not only the function as a sample-and-hold circuit but also the amplifying function, the further increased degree of precision will be required. Thus, by employing such a structure with which the noise components into the amplifier circuit are reduced, a considerable effect of suppressing the deterioration in the characteristics of A-D converter as a whole is obtained. Furthermore, when a cyclic-type A-D converter is used, the smaller size and further reduced power consumption can be achieved than the pipeline type A-D converter.

Sixth Embodiment

A structure according to a sixth embodiment of the present invention is based on the structure according to the fourth embodiment as shown in FIG. 8, and uses two power supplies that supply voltages of different magnitude. More specifically, the power supply voltage of circuit elements placed subsequent to a first source follower circuit 12 and a second source follower 14, when viewed from the input side of an analog signal Vin, is made smaller. Thereby, the power consumed by an analog-to-digital converter can be reduced.

Figure 10:
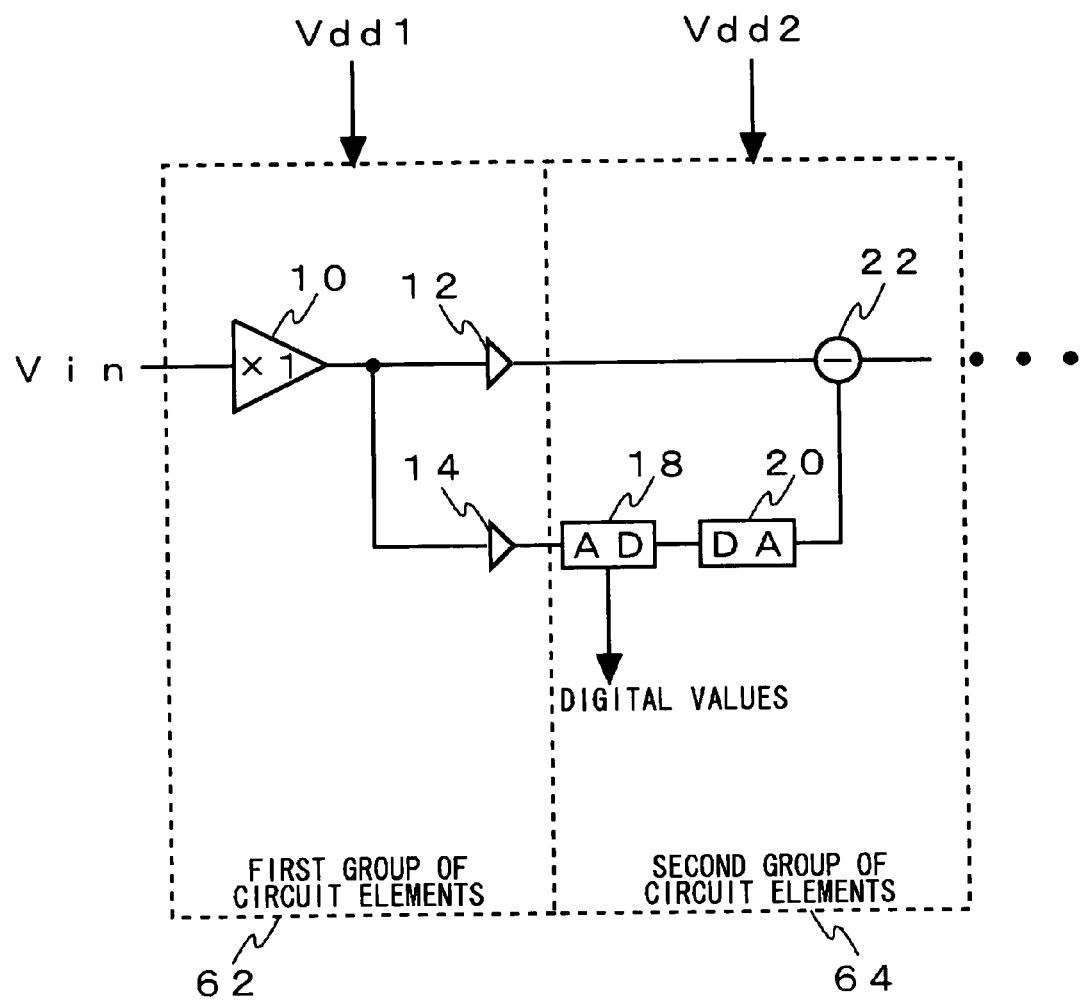
FIG. 10 illustrates a partial circuit of an A-D converter according to a sixth embodiment of the present invention.

FIG. 10 illustrates a structure of an A-D converter 6a according to the sixth embodiment of the present invention.

In FIG. 10, the structure members identical or similar to those of FIG. 8 are given the identical or like reference numerals and the repeated explanation thereof will be omitted where appropriate.

Compared with the A-D converter 6 of FIG. 8, the A-D converter 6a of FIG. 10 differs therefrom in that the power supply that supplies a high voltage Vdd1 to a first group of circuit elements and the power supply that supplies a low voltage Vdd2 to a second group of circuit elements are separately provided. The high voltage Vdd1 is about 3.3 V, for example, whereas the low voltage Vdd2 is about 1.8 V, for example. The power supplies are omitted in FIG. 10.

The first group of circuit elements 62 is constituted by a first source follower circuit 12, a second source follower circuit 14 and circuit elements provided anterior thereto viewed from the input side of the analog signal Vin. The second group of circuit elements 64 is constituted by circuit elements provided posterior to the first source follower circuit 12 and the second source follower circuit 14, viewed from the input side of the analog signal Vin.

The sixth embodiment also achieves the same advantageous effects as with the fourth embodiment. According to the sixth embodiment, the supply voltage of the first group of circuit elements 62 is set to the high voltage Vdd1 in accordance with the analog signal Vin. On the other hand, the supply voltage of the second group of circuit elements 64 that treat the analog signal which has been stepped down to a certain level greater than or equal to a threshold voltage of transistors, by the first source follower circuit 12 and the second source follower circuit 14, is set to the low voltage Vdd2. Thereby, the power consumed by the second group of circuit elements 64 can be reduced, as compared to a case where the same magnitude of voltage is supplied to the first group of circuit elements 62 and the second group of circuit elements 64. That is, the power consumed by the A-D convert 6a can be reduced. Furthermore, when the second group of circuit elements 64 is to be operated with the low voltage Vdd2, the voltage step-down can be done by the first source follower circuit 12 and the second source follower circuit 14. As a result, there will be no need to provide an extra voltage conversion circuit for the voltage step-down. Hence, the increase in circuit scale in the case of having the second group of circuit elements 64 operate under the low voltage Vdd2 can be prevented.

Seventh Embodiment

A structure according to a seventh embodiment of the present invention is based on the structure according to the sixth embodiment as shown in FIG. 10, and the multi-channel inputs, namely, a plurality of analog signals are inputted to a single A-D converter. A plurality of analog signals are, for example, the I components and Q components of a quadrature-modulated signal or the signals received by a plurality of antennas. The A-D converter converts and outputs sequentially a plurality of analog signals sampled simultaneously in a time-sharing manner.

Figure 11:
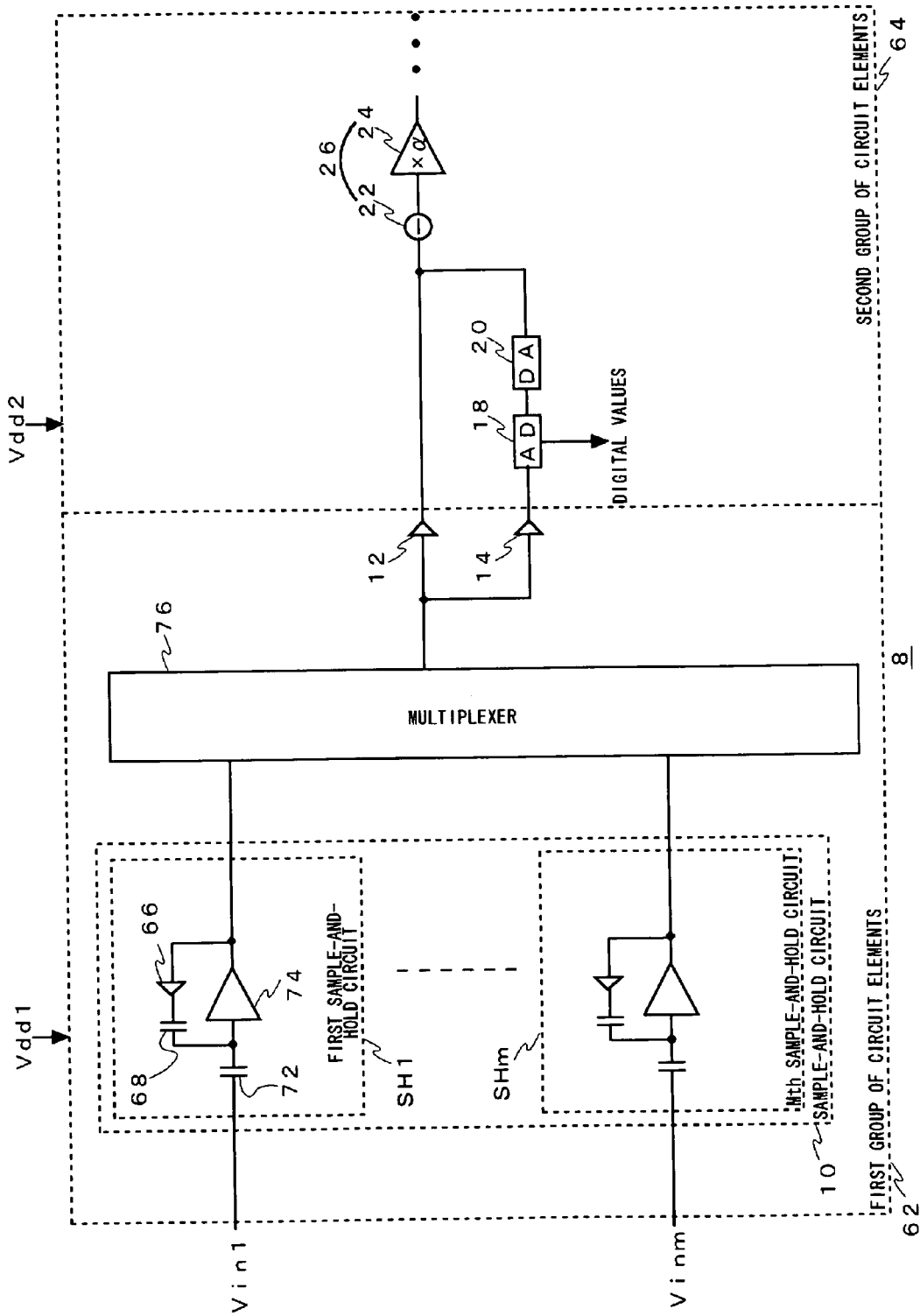
FIG. 11 illustrates a partial circuit of an A-D converter according to a seventh embodiment of the present invention.

FIG. 11 illustrates a structure of an A-D converter 8 according to the seventh embodiment. In FIG. 11, the structure members identical or similar to those of FIG. 10 are given the identical or like reference numerals and the repeated explanation thereof will be omitted as appropriate. A description of the seventh embodiment will be given centering around the differences from FIG. 10.

An A-D converter 8 of FIG. 11 recieves the inputs of m analog signals Vin1 to Vinm. A sample-and-hold circuit 10 includes a first sample-and-hold circuit SH1 to an mth sample-and-hold circuit SHm. The first sample-and-hold circuit SH1 to the mth sample-and-hold circuit SHm, respectively, sample the analog signals Vin1 to Vinm simultaneously and hold them. A multiplexer 76 selects any of outputs of the first sample-and-hold circuit SH1 to the mth sample-and-hold circuit SHm and then outputs the selected output to a first subtracter-amplifier circuit 26 and an A-D conversion circuit 18. For example, the selection by the multiplexer 76 is such that the analog signals are sequentially switched from Vin through Vinm per clock and this goes in cycles.

The first sample-and-hold circuit SH1 includes a differential amplifier 74, a feedback source follower circuit 66, a first capacitor 68 and a second capacitor 72. The second capacitor 72 is provided on a path that connects the analog signal Vin1 with the input terminal of the differential amplifier 74. The feedback source follower circuit 66 and the first capacitor 68 are connected in series between the output terminal of the differential amplifier 74 and the output terminal of the differential amplifier 74.

The first capacitor 68 and the second capacitor 72 have the same size of capacitance. The first sample-and-hold circuit SH1 samples the analog signal Vin1 obtained when a switch (not shown) provided parallel with the first capacitor 68 is switched off from on. The first sample-and-hold circuit SH1 holds the sampled analog signal Vin1 during a period in which the switch is off.

The feedback source follower circuit 66 is provided in correspondence to the first source follower circuit 12 and the second source follower circuit 14. In other words, the feedback source follower circuit 66 is provided in order that a difference becomes smaller between the magnitude of voltage at output terminals of the first source follower circuit 12 and the second source follower circuit 14 and the magnitude of voltage applied to the first capacitor 68 from the output of the differential amplifier 74.

The seventh embodiment also achieves the same advantageous effects as the sixth embodiment. Furthermore, according to the seventh embodiment, the effect of noise components, from the A-D conversion circuit 18 that operates in a time-sharing manner for the multi-channel input, upon the analog signal inputted to the first subtracter-amplifier circuit 26 can be reduced. In other words, when the selection at the multiplexer 76 is switched to an adjacent channel, the effect of the noise component, of the A-D conversion circuit 18, which has been generated before the switching upon the analog signal inputted to the first subtracter-amplifier circuit 26 after the switching can be reduced. As a result, the risk that the noise will propagate across the neighboring channels can be prevented. That is, the effect of the conversion in the multiplexer 76 before the switching of selection upon the conversion after the switching can be suppressed. Hence, the conversion precision of the A-D converter 8 that operates for the multi-channel input can be improved.

Moreover, according to the seventh embodiment, the characteristics of the first source follower circuit 12 and second source follower circuit 14 and those of the feedback source follower circuit 66 are adjusted to the same level. As a result, the difference between the magnitude of voltage at the output terminals of the first source follower circuit 12 and second source follower circuit 14 and that applied to the first capacitor 68 from the output of the differential amplifier 74 can be made small. Thereby, the conversion precision of the A-D converter 8 is enhanced. Moreover, according to the seventh embodiment, the first source follower circuit 12 and the second source follower circuit 14 are both provided in the positions subsequent to the multiplexer 76 so as to be commonly used for the multiple-channel input. Hence, the structure such that the increase in circuit scale is suppressed allows to prevent the risk that the noise will propagate across the neighboring channels.

Eighth Embodiment

A structure according to an eighth embodiment of the present invention is based on the structure according to the seventh embodiment as shown in FIG. 11. A description will be given of an example where a first source follower circuit 12 and a second source follower circuit 14 are provided at a stage subsequent to each of the first sample-and-hold circuit SH1 to mth sample-and-hold circuit SHm.

Figure 12:
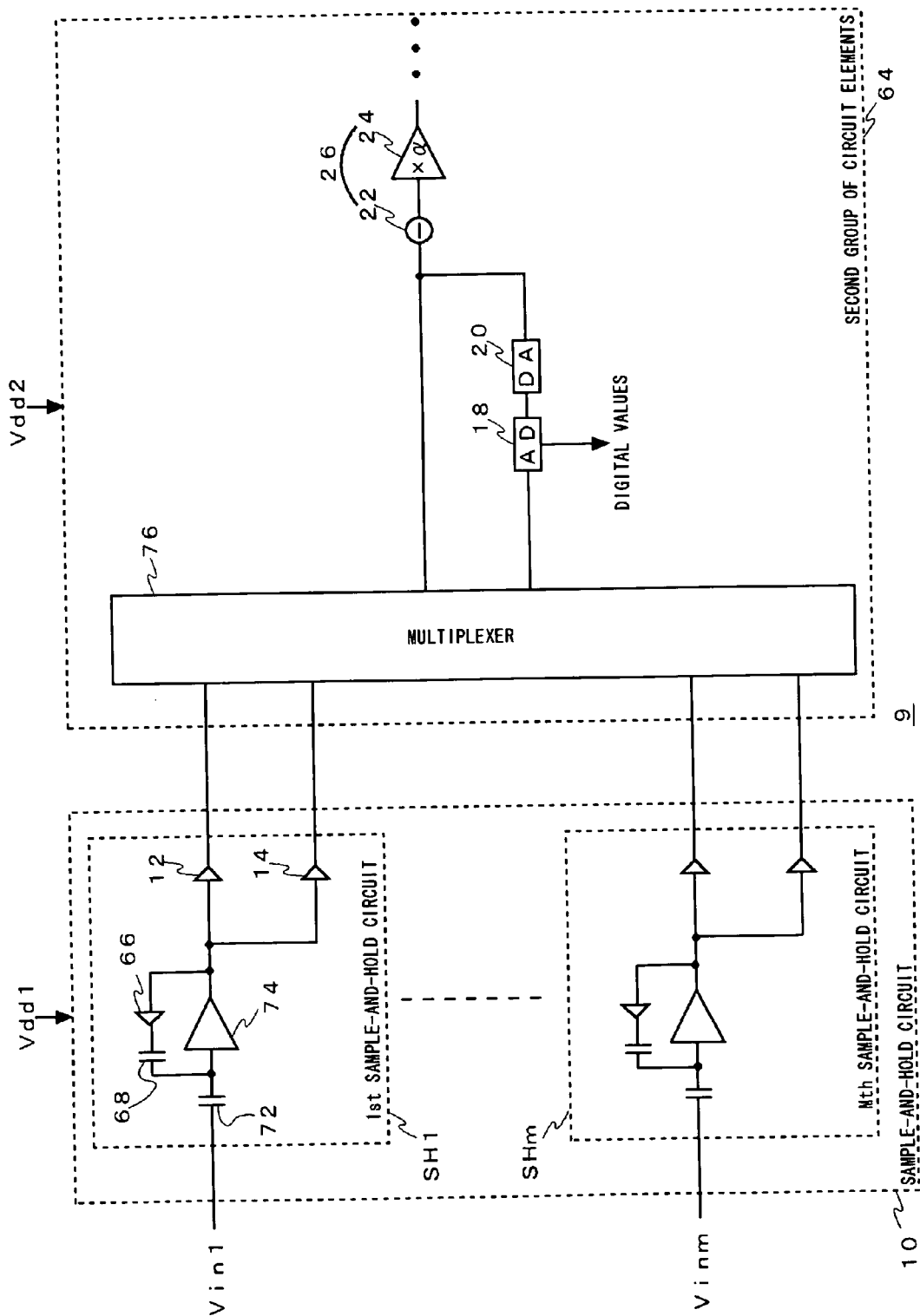
FIG. 12 illustrates a partial circuit of an A-D converter according to an eighth embodiment of the present invention.

FIG. 12 illustrates a structure of an A-D converter 9 according to the eighth embodiment. In FIG. 12, the structural components identical or similar to those of FIG. 8 are given the identical or like reference numerals and the repeated explanation thereof will be omitted as appropriate. A description of the eighth embodiment will be given focusing around the differences from FIG. 11.

In the A-D converter 9 shown in FIG. 12, the analog signal held in each of the first sample-and-hold circuit SH1 to mth sample-and-hold circuit SHm is branched out to a path for use with a first subtracter-amplifier circuit 26 and a path for use with an A-D conversion circuit 18, and is then outputted to a multiplexer 76 from an output stage for use with the first subtracter-amplifier circuit 26 and an output stage for use with the A-D conversion circuit 18. The first source follower circuit 12 is provided at the output stage for use with the subtracter-amplifier circuit 26 in the each of the first sample-and-hold circuit SH1 to mth sample-and-hold circuit SHm. The second source follower circuit 14 is provided at the output stage for use with the A-D conversion circuit 18 in the each of the first sample-and-hold circuit SH1 to mth sample-and-hold circuit SHm.

The eight embodiment also achieves the same advantageous effects as the seventh embodiment. According to the eighth embodiment, the source follower circuit 12 and the second source follower circuit 14 are provided before the multiplexer 76. By employing this structure, the length of a path connecting the differential amplifier 74 with the first source follower circuit 12 or the second source follower circuit 14 can be shortened and the noise on the path and the effect of wiring resistance can be reduced, as compared with a case where the first source follower circuit 12 and the second source follower circuit 14 are provided after the multiplexer 76. Thus, the difference between the signal inputted to the first source follower circuit 12 and second source follower circuit 14 and the signal inputted to a feedback source follower circuit 66 can be made smaller. The structure such that the first source follower circuit 12 and the second source follower circuit 14 are provided before the multiplexer 76 allows to adjust more precisely the level of the characteristics of the first source follower circuit 12 and second source follower circuit 14 and those of the feedback source follower circuit 66. Hence, the difference between the magnitude of voltage at the output terminals of the first source follower circuit 12 and second source follower circuit 14 and that applied to the first capacitor 68 from the output of the differential amplifier 74 can be made further smaller. Thereby the conversion accuracy of the A-D converter 9 can be further enhanced. Since the multiplexer 76 operates under the low voltage Vdd2, the power consumed by the A-D converter 9 can be reduced.

In the seventh embodiment, the structure by which the increase in circuit scale is suppressed allows to prevent the risk that the noise will propagate across the neighboring channels. According to the eighth embodiment, on the other hand, the risk that the noise will propagate across the neighboring channels is prevented and the creased accuracy in conversion can be achieved. When an A-D converter is to be designed, any of the above embodiments can be selected as appropriate in consideration of the required performance and the allowable circuit scale.

The present invention has been described based on the embodiments. These embodiments are merely exemplary, and various modifications to the combination of each component and process thereof are possible. It is understood by those skilled in the art that such modifications are also within the scope of the present invention.

In each of the above embodiments, the source follower circuit is used as a buffer circuit. However, the present embodiments are not limited thereto, and the source follower circuit may be replaced by an emitter follower circuit, a voltage follower circuit or the like.

An example where the source follower circuits are provided in the preceding stage is explained in the fifth embodiment. However, the present embodiments are not limited thereto, and such buffer circuits as the source follower circuits may be provided respectively to the inputs of an A-D conversion circuit in a subsequent stage after the first stage and an amplifier circuit provided parallel therewith. According to this modification, the delay in settling time of analog signals inputted to the amplifier circuit in the subsequent stage can be prevented.

In the seventh and the eighth embodiment, the power supply for supplying the high voltage Vdd1 and the power supply for supplying the low voltage Vdd2 are provided separately. However, it suffices if the power supply is the high voltage Vdd1 alone. According to this modification, too, the conversion precision of the A-D converter that operates for the multi-channel input can be improved. In the seventh and the eight embodiment, both the first source follower circuit 12 and the second source follower circuit 14 are provided as buffer circuits. However, the present embodiments are not limited thereto and a structure may be such that the second source follower circuit 14 only is provided as the buffer circuit. According to this modification, too, the effect of the noise generated from the A-D conversion circuit 18 on the input to the first subtracter-amplifier circuit 26 can be reduced.

The number of bits to be converted and the distribution thereof in the A-D conversion circuit and the gain values of an amplifier circuit and the like in each of the above embodiments are only exemplary. In various modifications conceivable, the other values may be adopted for these parameters. Also, the number of stages is not limited to one or two stages, and more than three stages may be applicable. At least one of such stages may be structured by a cyclic type.

While the preferred embodiments of the present invention have been described using specific terms, such description is for illustrative purposes only, and it is to be understood that changes and variations may be made without departing from the spirit or scope of the appended claims.

What is claimed is:

1. An analog-to-digital (A-D) converter, which converts an analog signal to a digital signal of a predetermined bit number a plurality of times, the A-D converter comprising:

an A-D conversion circuit which samples an inputted analog signal and converts it to a digital value of a bit number less than the predetermined bit number;

a first holding circuit which holds the inputted analog signal; and a buffer circuit provided on a path connecting an input side of said A-D conversion circuit with an input side of said first holding circuit.

2. An analog-to-digital converter according to claim 1, wherein said buffer circuit is a source follower circuit.

3. An analog-to-digital converter according to claim 1, further comprising a digital-to-analog (D-A) conversion circuit which converts an output signal of said A-D conversion circuit to an analog signal, wherein said first holding circuit subtracts the output signal of said D-A conversion circuit from the analog signal held, and amplifies a signal, obtained as a result of the subtraction, by a predetermined gain.

4. An analog-to-digital converter according to claim 1, further comprising:

a plurality of second holding circuits which sample and hold a plurality of analog signals to be inputted, respectively; and a signal selector which selects any of outputs of the plurality of second holding circuits and which outputs a selected output to said A-D conversion circuit and said first holding circuit.

5. An analog-to-digital converter according to claim 4, wherein the respective plurality of second holding circuits output, in a branched manner, the analog signal held to a path for use with said A-D conversion circuit and a path for use with said first holding circuit, and wherein said buffer circuit is provided on the path for use with said A-D conversion circuit.

6. An analog-to-digital converter according to claim 5, wherein said buffer circuit is provided on the path for use with said first holding circuit, in addition to the path for use with said A-D conversion circuit.

7. An analog-to-digital converter according to claim 6, wherein each of the plurality of second holding circuits includes:

a differential amplifier circuit which receives the analog signal to be inputted;

a feedback buffer circuit and a first capacitor which are connected in series between an output terminal of the differential amplifier circuit and an input terminal of the differential amplifier terminal and a second capacitor provided on a path through which the analog signal to be inputted is led to the input terminal of the differential amplifier circuit, wherein an output signal of the differential amplifier circuit is outputted, in a branched manner, to a path for use with said A-D conversion circuit and a path for use with said first holding circuit.

8. An analog-to-digital converter according to claim 6, wherein power supply voltage of a circuit element placed posterior to said buffer circuit when viewed from an input side of the analog signal is less than that of said buffer circuit and a circuit element placed anterior thereto.

9. An analog-to-digital converter according to claim 8, wherein said buffer circuit functions as a voltage converter circuit that steps down the inputted analog signal by a predetermined level.

10. An analog-to-digital (A-D) converter, which converts an analog signal to a digital signal a plurality of times, the A-D converter comprising:

a predetermined circuit element which outputs an analog signal;

an A-D conversion circuit which samples the analog signal outputted from said predetermined circuit element and converts it to a digital value of a predetermined bit number less than a targeted bit number; and a first holding circuit, provided in parallel with said A-D conversion circuit, which at least holds the analog signal sampled by said A-D conversion circuit, wherein a buffer circuit for said first holding circuit and a buffer circuit for said A-D conversion circuit are separately provided at an output side of said predetermined circuit element.

11. An analog-to-digital converter according to claim 10, wherein power supply voltage of a circuit element placed posterior to the buffer circuit for said first holding circuit and the buffer circuit for said A-D when viewed from an input side of the analog signal is less than that of the buffer circuit for said first holding circuit, the buffer circuit for said A-D and a circuit element placed anterior thereto.

12. An analog-to-digital converter according to claim 10, wherein said predetermined circuit element is a sample-and-hold circuit.

13. An analog-to-digital converter according to claim 10, wherein the buffer circuit for said first holding circuit is provided on a path connecting said predetermined circuit element with said first holding circuit, and the buffer circuit for said A-D conversion circuit is provided on a path connecting a connection point of said predetermined circuit element and the buffer circuit for said first holding circuit with said A-D conversion circuit.

14. An analog-to-digital converter according to claim 1, wherein said A-D conversion circuit receives the analog signal at one end of a capacitance connected to the input side thereof, and includes a voltage comparison element of capacitive coupling input type that samples the analog signal appearing at the other end of the capacitance.

15. An analog-to-digital converter according to claim 1, wherein said first holding circuit and said A-D conversion circuit are included in a block where the analog signal is first converted to the digital value.

16. An analog-to-digital converter according to claim 1, further comprising:

a D-A conversion circuit which converts an output signal of said A-D conversion circuit to an analog signal; and a subtracter circuit which subtracts the output signal of said D-A conversion circuit from an output signal of said first holding circuit, wherein, during a holding period, said first holding circuit amplifies the sampled analog signal by a predetermined gain, and wherein said subtracter circuit subtracts the output signal of said D-A conversion circuit amplified at the same predetermined gain.

* * * * *